United States Patent
Haga

(10) Patent No.: US 9,740,747 B2
(45) Date of Patent: Aug. 22, 2017

(54) SIMILAR DESIGN CASE EXAMPLE SEARCH APPARATUS

(75) Inventor: Noriyuki Haga, Yokohama (JP)

(73) Assignee: HITACHI, LTD., Tokyo (JP)

( * ) Notice: Subject to any disclaimer, the term of this patent is extended or adjusted under 35 U.S.C. 154(b) by 1072 days.

(21) Appl. No.: 13/979,907

(22) PCT Filed: Jan. 20, 2012

(86) PCT No.: PCT/JP2012/000330
§ 371 (c)(1),
(2), (4) Date: Jul. 16, 2013

(87) PCT Pub. No.: WO2012/120762
PCT Pub. Date: Sep. 13, 2012

(65) Prior Publication Data
US 2013/0290351 A1 Oct. 31, 2013

(30) Foreign Application Priority Data
Mar. 8, 2011 (JP) ................................. 2011-049767

(51) Int. Cl.
*G06F 17/00* (2006.01)
*G06F 17/30* (2006.01)
*G06F 17/50* (2006.01)

(52) U.S. Cl.
CPC .... *G06F 17/3053* (2013.01); *G06F 17/30392* (2013.01); *G06F 17/5095* (2013.01)

(58) Field of Classification Search
CPC .................................................. G06F 17/5095
See application file for complete search history.

(56) References Cited

U.S. PATENT DOCUMENTS 5,572,430 A * 11/1996 Akasaka ................. G06F 17/50
700/95
5,576,965 A * 11/1996 Akasaka ................. G06F 17/50
700/97

(Continued)

FOREIGN PATENT DOCUMENTS

| JP | 7-37007 | 2/1995 |
| JP | 7-219989 | 8/1995 |

(Continued)

*Primary Examiner* — Truong Vo
(74) *Attorney, Agent, or Firm* — Baker Botts L.L.P.

(57) ABSTRACT

A similar design case example search apparatus includes a design case example storage unit that manages such information as specification values of design case examples of past products and costs and period for manufacturing the products; a recommended weight storage unit that stores recommended weight for every requirement specification categories; a requirement specification receiving unit that receives requirement specification values; a requirement specification satisfaction degree calculation unit that calculates a requirement specification satisfaction degree which is the degree that the specification values of each design case example stored in the design case example storage unit satisfy the requirement specification values; a recommended degree calculation unit that calculates a recommended value of a searched design case example based on the recommended weight stored in the recommended weight storage unit; and a search result display unit that displays searched products with similarity and recommended degrees and can sort the data by the similarity and the recommended degree.

4 Claims, 8 Drawing Sheets

(56) References Cited

U.S. PATENT DOCUMENTS

| | | | |
|---|---|---|---|
| 5,734,890 A * | 3/1998 | Case | G06Q 30/02 |
| 8,442,850 B2 * | 5/2013 | Schorr | G06Q 10/06 705/30 |
| 2006/0217823 A1 * | 9/2006 | Hussey | G06F 11/2247 700/87 |
| 2009/0093901 A1 * | 4/2009 | Awile | G06F 17/50 700/97 |
| 2010/0161364 A1 * | 6/2010 | Lokowandt | G06Q 10/0631 705/7.12 |
| 2010/0161366 A1 * | 6/2010 | Clemens | G06Q 30/06 705/7.29 |
| 2011/0219348 A1 * | 9/2011 | Liu | G06F 9/455 716/132 |

FOREIGN PATENT DOCUMENTS

| | | |
|---|---|---|
| JP | 9-150350 | 6/1997 |
| JP | 9-179892 | 7/1997 |
| JP | 2001-14021 | 1/2001 |
| JP | 2007-149072 | 6/2007 |

* cited by examiner

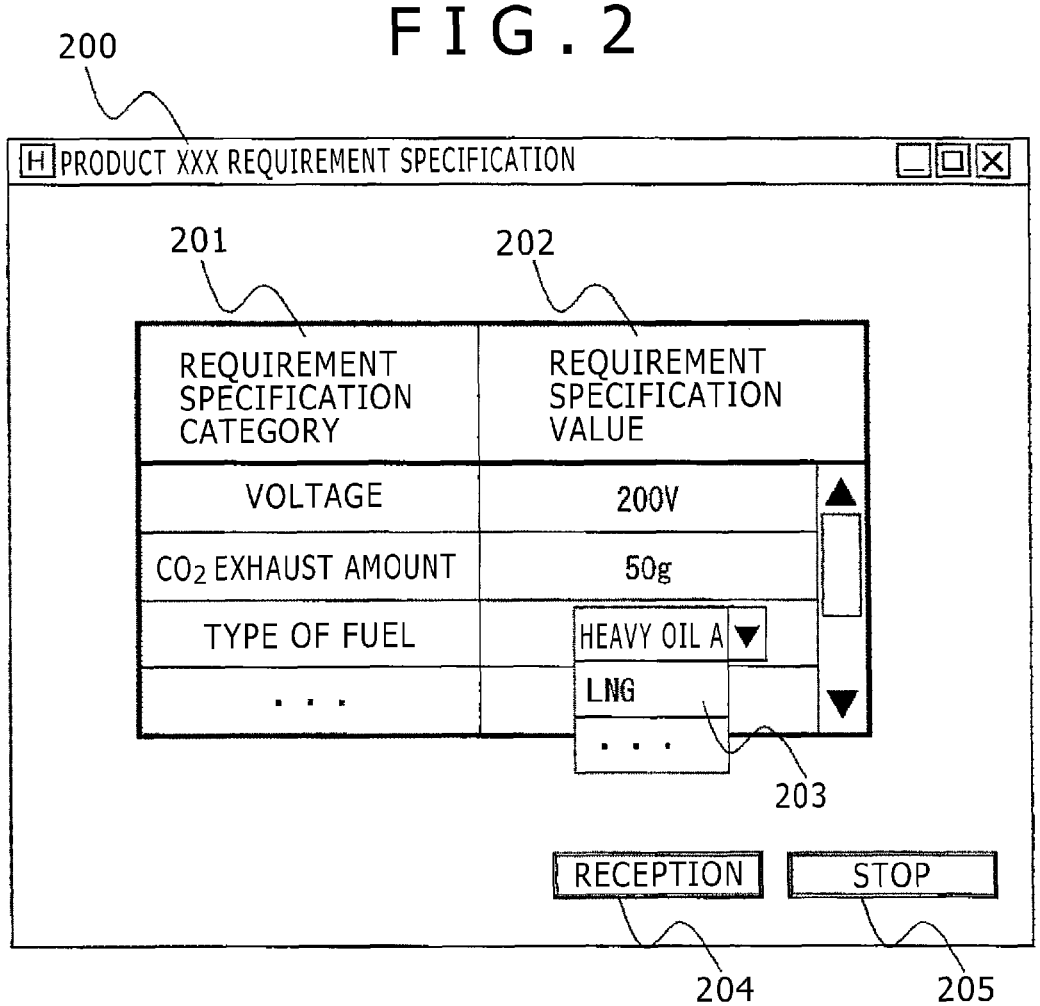

FIG.4

| SPECIFICATION CATEGORY | CASE EXAMPLE No. | A1 | A2 | A3 |
|---|---|---|---|---|
| REQUIREMENT SPECIFICATION | VOLTAGE | 200V | 200V | 200V |
| | $CO_2$ EXHAUST AMOUNT | 50g | 80g | 80g |
| | TYPE OF FUEL | HEAVY OIL A | HEAVY OIL A | LNG |
| EQUIPMENT MODEL NUMBER | | PP675001 | PP675002 | PP675003 |
| EQUIPMENT SPECIFICATION | EQUIPMENT SIZE | 200x500 | 400x400 | 200x600 |
| | EQUIPMENT WEIGHT | 500 | 350 | 600 |
| | COST | 500 | 250 | 1000 |
| | STANDARD PRODUCT | NON-STANDARD | STANDARD | QUASI-STANDARD |
| | QUALITY (FAILURE RATE) | 0.05 | 0.001 | 0.05 |
| | DELIVERY PERIOD (LEAD TIME) | 10 DAYS | 10 DAYS | 90 DAYS |

FIG. 6

| SPECIFICATION CATEGORY | REQUIREMENT SPECIFICATION VALUE | WEIGHT OF SPECIFICATION CATEGORY SATISFACTION DEGREE | CASE EXAMPLE No. A1 | | | A2 | | | A3 | | |
|---|---|---|---|---|---|---|---|---|---|---|---|
| | | | SPECIFICATION VALUE | ALIGNMENT DEGREE | SATISFACTION DEGREE | SPECIFICATION VALUE | ALIGNMENT DEGREE | SATISFACTION DEGREE | SPECIFICATION VALUE | ALIGNMENT DEGREE | SATISFACTION DEGREE |
| VOLTAGE | 200V | 100 | 200V | 1.0 | 100 | 200V | 1.0 | 100 | 200V | 1.0 | 100 |
| $CO_2$ EXHAUST AMOUNT | 50g | 50 | 50g | 1.0 | 50 | 80g | 0.0 | 0 | 80g | 0.0 | 0 |
| TYPE OF FUEL | HEAVY OIL A | 100 | HEAVY OIL A | 1.0 | 100 | HEAVY OIL A | 1.0 | 100 | LNG | 0.0 | 0 |
| TOTAL SATISFACTION DEGREE | | | 100 | | | 80 | | | 40 | | |

FIG. 7

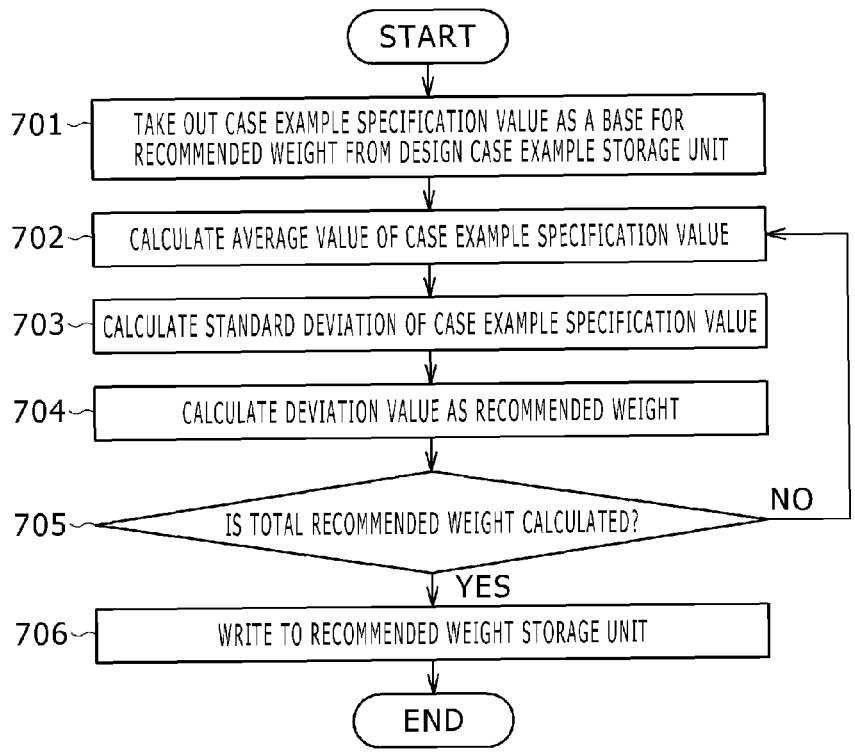

FIG. 8

| RECOMMENDED WEIGHT FACTOR \ CASE EXAMPLE No. | CASE EXAMPLE SPECIFICATION VALUE | | | CASE EXAMPLE SPECIFICATION VALUE AVERAGE VALUE | CASE EXAMPLE SPECIFICATION VALUE STANDARD DEVIATION | RECOMMENDED WEIGHT | | |
|---|---|---|---|---|---|---|---|---|
| | A1 | A2 | A3 | | | A1 | A2 | A3 |
| COST | 500 | 250 | 1000 | 583.33 | 381.88 | 59 | 85 | 6 |
| STANDARD PRODUCT | 0 | 100 | 30 | 43.33 | 51.32 | 16 | 94 | 40 |
| QUALITY (FAILURE RATE) | 0.05 | 0.001 | 0.05 | 0.03 | 0.03 | 27 | 96 | 27 |
| DELIVERY PERIOD (LEAD TIME) | 10 | 10 | 90 | 36.67 | 46.19 | 73 | 73 | 4 |

FIG. 9

☐ ORDER RECEIVING POLICY SELECTION

○ IMPORTANCE ATTACHED TO COST

● IMPORTANCE ATTACHED TO STANDARD PRODUCT

○ IMPORTANCE ATTACHED TO QUALITY

○ IMPORTANCE ATTACHED TO LEAD TIME

[DECIDE SELECTION] [CANCEL]

| | CASE EXAMPLE No.→ | A1 | | A2 | | A3 | |
|---|---|---|---|---|---|---|---|
| RECOMMENDED WEIGHT FACTOR | ORDER RECEIVING POLICY VALUE ↓ | RECOMMENDED WEIGHT | RECOMMENDED DEGREE | RECOMMENDED WEIGHT | RECOMMENDED DEGREE | RECOMMENDED WEIGHT | RECOMMENDED DEGREE |
| COST | 0.50 | 59 | 29 | 85 | 42 | 6 | 3 |
| STANDARD PRODUCT | 1.00 | 16 | 16 | 94 | 94 | 40 | 40 |
| QUALITY | 0.50 | 27 | 13 | 96 | 48 | 27 | 13 |
| LEAD TIME | 0.50 | 73 | 37 | 73 | 37 | 4 | 2 |
| | TOTAL RECOMMENDED DEGREE | | 24 | | 55 | | 15 |

FIG.12

| DESIGN CASE EXAMPLE | REQUIREMENT SPECIFICATION SATISFACTION DEGREE | RECOMMENDED DEGREE | TOTAL EVALUATION | MODEL NUMBER | COST |
|---|---|---|---|---|---|
| A1 | 100 | 24 | 124 | P675001 | 500 |
| A2 | 80 | 55 | 135 | P675002 | 250 |
| A3 | 40 | 15 | 55 | P675003 | 1000 |

☐ LIST OF DESIGN CASE EXAMPLE SEARCH RESULT

CLOSE REGISTER

SIMILAR DESIGN CASE EXAMPLE SEARCH APPARATUS

BACKGROUND

The present invention concerns a similar design case example search apparatus.

The background of the technical field of the present invention includes Japanese Unexamined Patent Application Publication No. H07 (1995)-219989, and the publication includes the following descriptions.

The invention of the cited reference intends to provide a similar design case example search apparatus capable of searching similar design case examples of an identical design specification at a high speed while considering restriction and interference relation in view of design in specification categories.

The apparatus comprises a requirement specification input unit for inputting requirement specifications to a design target, a knowledge base that stores knowledge for judging a design specification to be applied in view of the requirement specifications, a design specification judging unit having an inference engine that judges a design specification to be applied by using a knowledge on the basis of the requirement specifications, a design case example storage unit that stores a design case example base storing past design case examples, a similar case example searching unit that searches past design case examples having design specifications substantially identical with the design specification judged by the design specifications judging unit from the design case example base, and a search result output unit that outputs the contents of the past design case examples which are searched by the similar case example search unit.

SUMMARY

Japanese Unexamined Patent Application Publication No. H07(1995)-219989 describes a similar design case example search apparatus that searches a design case example substantially identical with the specifications of past design case example from a design case example data base to a requirement specifications by a customer for a product or a design target as similar design case examples and outputs the retrieved similar design case example.

However, in the similar design case example search apparatus, as outputted design case examples, only design case examples which are coincident with or similar as much as possible with the requirement specification from the customer, etc. are searched and this is not a search for similar design case example considering a cost, a delivery lead time, etc. for a product supplier. Accordingly, the cost for actually manufacturing products is sometimes higher than the usual cost, or the lead time for procurement and fabrication of necessary parts is sometimes longer than usual. Thus, products cannot be sold at an appropriate price to result in loss for the product supplier, or appropriate procurement and manufacturing time cannot be ensured to cause a delivery delay to the customer.

Further, when the requirement specifications from a customer are ambiguous, similar search that compensates the ambiguous requirement specifications is necessary. Since a plurality of ways of compensation may be considered and a plurality of times of similar search are performed for the plurality of requirement specifications, a large number of similar design case examples are outputted. However, this is not taken into consideration in the apparatus of the cited reference.

Further, when the search is performed while compensating the requirement specifications, the number of compensation method corresponds to the number of combination of requirement specification categories, and search has to be performed by preparing a large number of combinations of requirement specifications, which takes an extremely long search processing time, and shortening of the processing time is required.

Further, when the design case examples are accumulated along with use of the apparatus, number of design case examples of substantially identical requirement specifications often increases, and only substantially identical design case examples are obtained in the similar search result, by which the user designer provided with the search result is confused in the selection of them. It is necessary for a designer to evaluate the design case example not only by the similarity with the requirement specification but also refine the design case example by evaluating procurement and manufacture of the design case examples. However, this is not taken into consideration in the apparatus of the cited reference.

In view of the above, it is intended in the present invention to provide a similar design case example search apparatus capable of refining the result of search by evaluating the cost and the lead time relevant to procurement and manufacture in addition to the search result similar with requirement specifications so as to appropriately reduce the number of the similar design case examples in the result of search for similar design case examples.

For solving the subject described above, the present invention provides the configurations to be described below.

The present invention includes a plurality of configurations for solving the subject and includes, as an example thereof, a similar design case example search apparatus for evaluating conditions satisfying requirement specification values, and specifications relevant to procurement and manufacture in view of past design case examples, and searching a matching design case example, in which the apparatus includes: a design case example storage unit that manages each of specification values of design case examples of past products and each of specification category values relevant to procurement and manufacture necessary for manufacturing the product; a recommended weight storage unit that stores specification values and recommended weight for every design case examples corresponding to each of specification categories relevant to procurement and manufacture; a requirement specification receiving unit that receives requirement specification values of a product as a design target from a user; an order receiving policy receiving unit that receives selection of categories to which importance is attached in the specification categories relevant to procurement and manufacture from the user; a requirement specification satisfaction degree calculation unit that calculates an alignment degree of a specification value of the specification category of each of design case examples stored in the design case example storage unit for the requirement specification value, and calculating a satisfaction degree for every design case examples and for every requirement specification categories with reference to the satisfaction degree weight for each of the specification categories; a recommended degree calculation unit that reads a recommended weight of a design case example stored in the recommended weight storage unit and calculates a recommended degree of each of design case examples on the basis of the order receiving policy received in the order receiving policy receiving units; and a search result display unit that displays the design case examples read from the design case example storage unit and evaluated in a list of design case example search results for one of the requirement specification satisfaction degree, the recommended degree, or total evaluation in the order of higher evaluation value.

According to the invention, it is possible to provide a suitable design case example for a requirement specification in a short time to a designer, and decrease the number of design steps, shorten the design time, improve the design quality, and reduce the product cost.

Other objects, constitutions, and effects than those described above will become apparent by the following description for the preferred embodiments.

BRIEF DESCRIPTION OF THE DRAWINGS

FIG. 2 illustrates an example of a screen of a requirement specification receiving unit;

FIG. 3 illustrates an example of a table of requirement specification data;

FIG. 4 illustrates an example of a table in a design case example storage unit;

FIG. 6 illustrates an example of data for the calculation result of requirement specification satisfaction degree;

FIG. 7 illustrates an example of a flow chart for explaining processing of a recommended weight setting unit;

FIG. 8 illustrates an example of a table of a recommended weight storage unit;

FIG. 9 illustrates an example of a screen of an order receiving policy receiving unit;

FIG. 12 illustrates an example of a screen of a search result display unit.

DETAILED DESCRIPTION

Preferred embodiments of the invention are to be described with reference to the drawings.

First Embodiment

Figure 1:
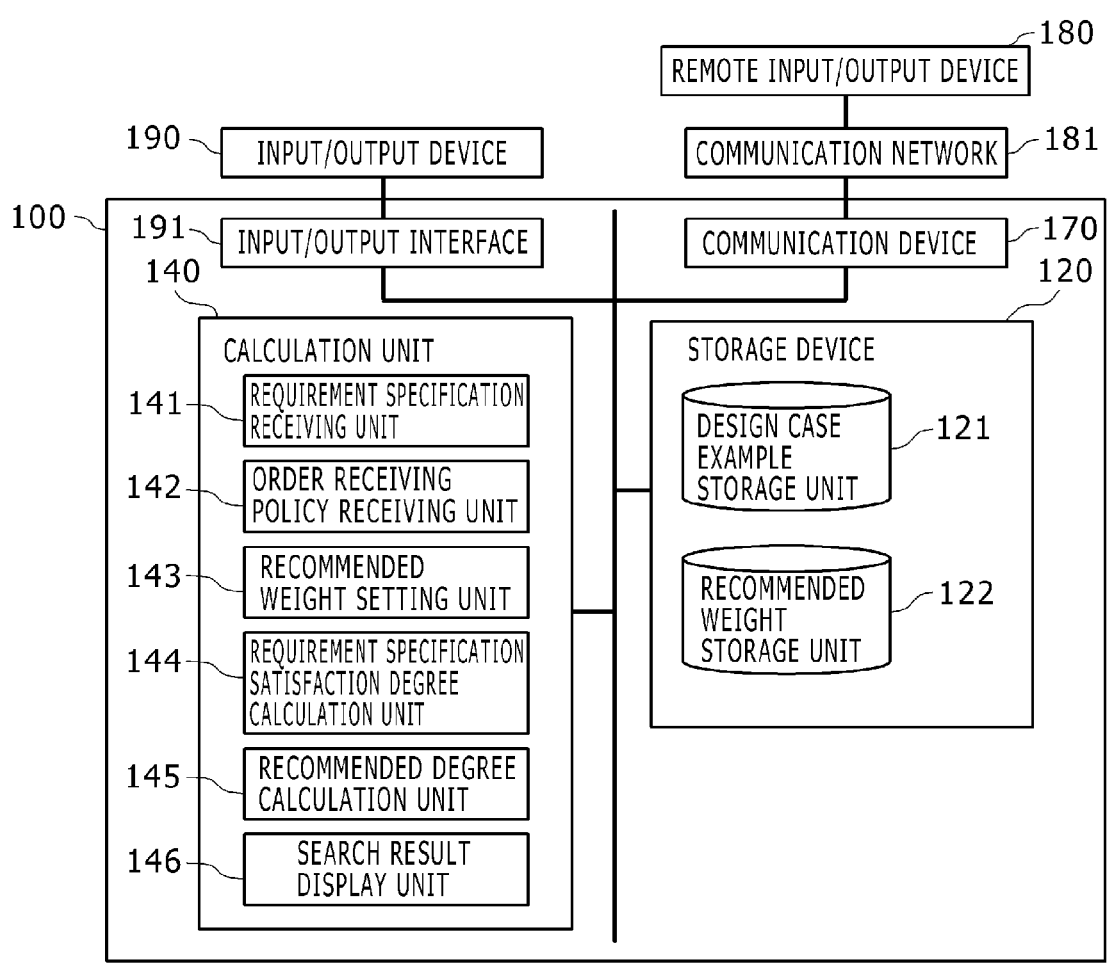
FIG. 1 illustrates an example of a configurational view of a similar design case example search apparatus.

FIG. 1 is a schematic view of a similar design case example search apparatus 100 and peripheral units in the invention.

An input/output device 190 performs input of specification value data, output of relevant design information, etc., and preferably comprises a keyboard, a mouse, a display, a printer, etc. which are general input/output devices of a computer. However, the configuration of the apparatus is not restricted to them.

An input/output interface 191 is a portion of the similar design case example search apparatus 100 of the invention and performs data exchange to and from the input/output device 190.

A remote input/output device 180 is used for input/output of data in a distant place. While the content of processing is identical with that of the input/output device 190, a communication network 181 is interposed for data exchange to and from the similar design case example search apparatus 100.

A communication device 170 is a device for connecting the similar design case example search apparatus 100 to the communication network 181.

A storage device 120 in FIG. 1 comprises the following storage units.

A design case example storage unit 121 is a region for storing case examples of product design as a target.

This is a region for storing data of values such as for specification in the form of data recording at least having requirement specification information, equipment model numbers, and equipment specification information for every design case examples. For example, FIG. 4 illustrates an example of a data table stored in the design case example storage unit 121. Data categories to be recorded such as requirement specification, equipment model number, and equipment specification category are arranged on the ordinate of the data table. For the data category, specifically, voltage, $CO_2$ exhaust amount, type of fuel, etc. are arranged as the data categories of requirement specification of a design target product. Product name of design case examples designed and registered in the past (product ID for determining products) are arranged as A1, A2, A3 on the abscissa of the data table and value data for the specification category in the ordinate are stored for every case examples. For example, value data for the specification of design case examples are stored, for example, as 200 V for voltage, 50 g for $CO_2$ exhaust amount, heavy oil A as the type of fuel in a case example number A1.

The recommended weight storage unit 122 is a region for storing the recommended weight representing the evaluation degree of the design case examples registered in the design case example storage unit 121 for every design case examples where an importance should be attached to the specification category (recommended weight factor) in the search. FIG. 8 illustrates an example of a data table stored in the recommended weight storage unit 122. In the recommended weight storage unit 122, recommended weight factors (specification categories) as the target for evaluating the recommended weight are arranged on the ordinate of the data table, specification values for the specification categories, average values for the design case example specification values, standard deviations for the design case example specification values, and the recommended weight of each of design case examples are arranged on the abscissa of the data table, and the corresponding value data are stored for every recommended weight factors on the ordinate. For example, for "cost" of the recommended weight factor on the ordinate in FIG. 8, the case example specification values are stored as 500 for A1, 250 for A2, and 1000 for A3. Further, for the recommended weight factor "cost", the average value for the case example specification value is stored as 583.33 and the standard deviation for the case example specification value is stored as 381.88. Further, for the recommended factor "cost", the recommended weight is stored as 59 for A1, as 85 for A2, and as 6 for A3.

The calculation device 140 in FIG. 1 comprises the following functional units.

The requirement specification receiving unit 141 is a unit for receiving, from a user, requirement specification data of target design case examples to be searched by the similar design case example search apparatus 100, and receives data, for example, by a screen provided to the user. An example of a user interface screen is shown in FIG. 2. In the screen of FIG. 2, input data are received in the form of a table. Input data are received in the data categories in the column for the requirement specification value 202 for every data categories in the column of the requirement specification category 201. In the screen of FIG. 2, a data of requirement specification value "200 V" is received for the "voltage" in the requirement specification category. As the receiving method, it may be considered to receive the value of the requirement specification by way of the input/output interface 191 by receiving the value inputted directly through a keyboard of the input/output device 190, or by displaying pull-down options of the requirement specification value and receiving the specification value indicated and selected by a mouse of the input/output device 190 as at 203 in FIG. 2. FIG. 3 illustrates an example of data received and held in the requirement specification receiving unit 141. The held data comprises requirement specification categories and requirement specification values and, for example, a requirement specification value "200 V" is held as "voltage" of the requirement specification category.

The order receiving policy receiving unit 142 is a unit for receiving an order receiving policy upon searching similar design case examples by using the requirement specification values received in the requirement specification receiving unit 141. Specifically, the order receiving policy is received on a screen as shown in FIG. 9. The example of the screen in FIG. 9, displays options such as attachment of importance to cost, to standard product, to quality, to lead time, etc. as the order receiving policy, and receives the indication at present of the order receiving policy. In the example of the screen in FIG. 9, while only one of the policies is received, a plurality of policies can also be received from the options.

The recommended weight setting unit 143 is a functional unit for performing the processing of setting recommended weight for each of design case examples on the basis of design case example data stored in the design case example storage unit 121. FIG. 7 illustrates an example of a flow chart for performing processing of setting the recommended weight. FIG. 8 illustrates an example of a data table stored in the recommended weight storage unit 122 used for the processing of the recommended weight setting unit 143. At a processing step 701, specification value data of design case examples as a target for which the recommended weight is to be set is taken out from the design case example storage unit 121, and held in each of the columns for the case specification values showing the example of the data table in FIG. 8. For example, in this embodiment, the specification value of the specification category "standard product" of the design case example is converted as 100 in a case where it is "standard", as 30 where it is "quasi-standard", and as zero where it is "non-standard" and they are held in the data table.

At a processing step 702, average values for the design case example specification values taken out for each of the recommended weight factors are calculated. The data as the result of the calculation is shown in the column for the average values in the table of FIG. 8. At a processing step 703, standard deviations for the design case example specification values are calculated. The data as the result of the calculation is shown in the column for the standard deviation of FIG. 8. At a processing step 704, deviation values for the specification value of the design case examples is calculated for every design case examples and the result is shown in the recommended weight column of FIG. 8. As a specific example of the calculation, the recommended weight is calculated for the recommended weight factor "standard product" according to the following calculation formula 1.

$$\text{Recommended weight} = |\text{Case example specification value} - \text{Average value for case example specification value}| * 40 / \text{standard deviation for case example specification value} + 50 \quad \text{(Formula 1)}$$

The table shows that the recommended weight increases in a recommended case example, and this is a positively recommended case. On the other hand, since the recommended weight factor "cost" is recommended when the cost is low, the recommended weight is calculated according to the following calculational formula (formula 2).

$$\text{Recommended weight} = |-\text{Case example specification value} + \text{Average value for case example specification value}| * 40 / \text{standard deviation for case example specification value} + 50 \quad \text{(Formula 2)}$$

Since it may suffice that the value can be set so as to increase the recommended weight in a recommended case, any other calculation method such as simple normalization can also be adopted instead of the processing that determines the deviation value as in the calculation described above. At a processing step 705, calculation for all recommended weight of the recommended weight factors is repeated and the calculated result is registered in the recommended weight storage unit 122 at a processing step 706.

The requirement specification satisfaction degree calculation unit 144 is a functional unit that calculates a requirement specification satisfaction degree of each of design case examples stored in the design case example storage unit 121 on the requirement specification received by the requirement specification receiving unit 141.

Figure 5:
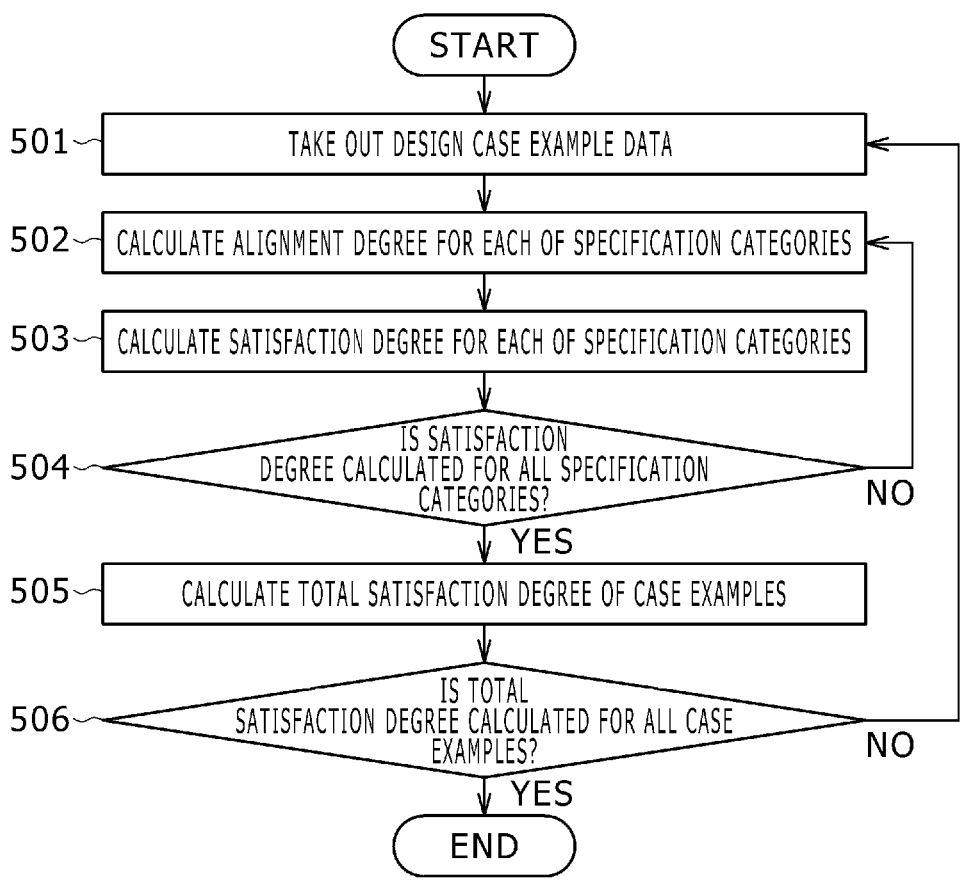
FIG. 5 illustrates an example of a flow chart for explaining processing in a requirement specification satisfaction degree calculation unit.

FIG. 5 illustrates an example of a flow chart of the processing that calculates a requirement specification satisfaction degree.

At a processing step 501, one design case example data is taken out from the design case example storage unit 121.

At a processing step 502, an alignment degree between the specification value for each of the specification categories of the requirement specification received in the requirement specification receiving unit 141 and a specification value of the specification category of the design case example data. FIG. 6 illustrates an example for the result of the processing. An alignment degree of the specification category "voltage" is 1.0 for a case A1. In this example, alignment is expressed as 1.0 when the requirement specification value and the specification value of the case example are aligned with each other and as 0.0 when they are not aligned. In the processing of calculating the alignment, it may suffice that alignment or not alignment between a requirement specification value and a specification value of the case examples can be expressed, and calculation by way of ratio or difference may also be used as the calculation method.

At a processing step 503, a satisfaction degree for each of specification categories is calculated. In the example of FIG. 6, the satisfaction degree is calculated according to the following calculational formula (formula 3).

$$\text{Satisfaction degree} = \text{Satisfaction degree weight of specification category} * \text{alignment degree} \quad \text{(Formula 3)}$$

In the example of FIG. 6, the satisfaction degree of the specification category "voltage" is 100 in the case example A1. The satisfaction degree weight of the specification category is a value indicating the requirement importance. While the weight is different depending on the specification category in the example of FIG. 6, all of them may also be identical.

At a processing step 504, processing is repeated till the satisfaction degrees are calculated for all of the specification categories of each of the design case examples corresponding to each of the requirement specification categories. When the satisfaction degree of each of the specification categories for each of the design case examples can be calculated, the entire satisfaction degree for each of the design case examples is calculated as a total satisfaction degree at a processing step 505. The calculational formula (formula 4) in the example of FIG. 6 is as described below Total satisfaction degree=Total of satisfaction degree/total of satisfaction degree weight of specification categories*100    (Formula 4)

In the case example A1, since all of the specification categories are aligned, the total satisfaction degree is 100.

At a processing step 506, processing is repeated till the total satisfaction degree is calculated for all of the design case examples.

Figures 10, 11:
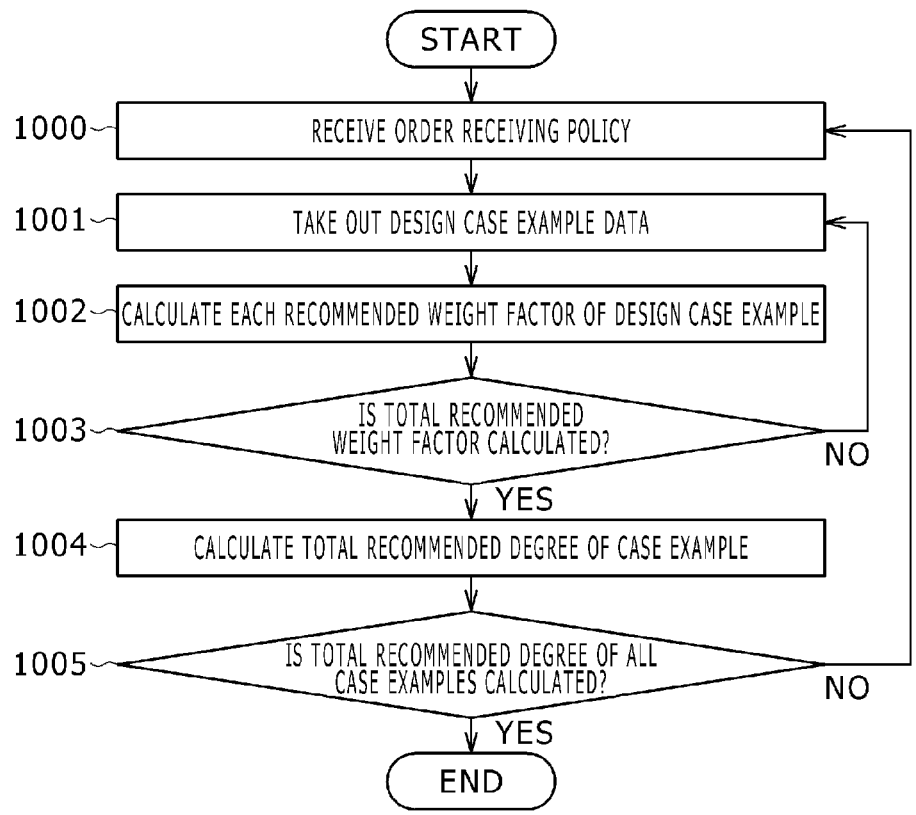
FIG. 10 illustrates an example of a flow chart for explaining processing in a recommended degree calculation unit.
FIG. 11 illustrates an example of data for the calculation result of recommended degree.

The recommended degree calculation unit 145 is a functional unit that reads the recommended weight of the design case examples stored in the recommended weight storage unit 122 by the order receiving policy received by the order receiving policy receiving unit 142 and performs the processing for calculating the recommended degree of each of design case examples. An example of a flow chart for explaining processing in a recommended degree calculation unit is shown in FIG. 10.

At a processing step 1000, the order receiving policy is received by the order receiving policy receiving unit 142 and the data is held. FIG. 11 illustrates an example of date held in the recommended degree calculation unit 145. The order receiving policy received at the processing step 1000 is held in the form of numerical values. For example, when the order receiving policy is received on the screen shown in FIG. 9, since importance is attached to the standard product by the order receiving policy, only the order receiving policy value is 1.0 only for the standard product and other order receiving policy values are 0.5.

At a processing step 1001, a recommended weight of the design case example stored in the recommended weight storage unit 122 is taken out and held. At a processing step 1002, the recommended degree of each of the recommended weight factors for each of the design case examples is calculated on the basis of the recommended weight of the design case example and the order receiving policy value. In the example of FIG. 11, the recommended degree of the recommended weight factor "cost" is calculated as 29 for a case example A1. The calculational formula (formula 5) in this example is as described below.

Recommended degree=Recommended weight*Order receiving policy value    (Formula 5)

At a processing step 1003, processing is repeated till all recommended degrees are calculated to each of the recommended weight factors in the design case example.

At a processing step 1004, a total recommended degree of the design case example is calculated. In the example of FIG. 11, an average value for the recommended degree in the case example A1 is calculated as 24 as a total recommended degree.

At a processing step 1005, processing is repeated till the total recommended degrees are calculated for all of the case examples.

The search result display unit 146 displays the requirement specification satisfaction degree of each of the design case examples calculated by the requirement specification satisfaction degree calculation unit 144 and the recommended degree for each of the design case examples calculated by the recommended degree calculation unit 145. FIG. 12 illustrates an example of a display screen. A requirement specification satisfaction degree and a recommended degree are displayed for each of the design case examples. As the total evaluation, the total for the requirement specification satisfaction degree and the recommended degree is displayed. In this example, since case examples are arranged in an order where the requirement specification satisfaction degree is higher, the case example A1 is at a top of the arrangement of the case examples. However, in view of the recommended degree for the case example A1, the degree is lower than that of the case example A2, and it can be seen that this is not always an excellent design case example. When the recommended degrees are displayed being sorted in the order of recommended degree, the design case example A2 is at the top end of the arrangement and a different arrangement is shown as the search result of design case examples. Further, when the design case examples are arranged in view of the total evaluation as the sum for the requirement specification satisfaction degree and the recommended degree, A2 is at the top end of the arrangement.

The present invention is not always restricted to the embodiments described above but includes various modification embodiments. For example, the previously shown embodiments have been described specifically for easy explanation of the present invention and the invention is not always restricted to those having all of such configurations. Further, a portion of the configuration of an embodiment can be replaced with the configuration of other embodiments, or a configuration of an embodiment can be incorporated with the configuration of other embodiments. Further, other configuration may be added to, deleted from, or replaced with part of configuration of respective embodiments.

Further, each of the configurations, functions, processing sections, processing units, etc. described above may be partially or entirely realized in hardware, for example, by designing them by an integrated circuit. Further, each of the configurations, functions, etc. described above may also be realized by software in which a processor interprets a program for realizing respective functions and executing them. Information such as in program, table, file, etc. for realizing each of the functions may be provided in a recording device such as a memory, hard disk, or SSD (Solid State Drive), or may be provided in a recording medium such as IC card, SD card, or DVD.

Further, control lines and information lines which are considered necessary in view of explanation are shown, and all of control lines and information lines are not always shown in view of products. It may be considered that substantially all of the configurations are actually connected to each other.

What is claimed is:

1. A similar design case example search apparatus for evaluating conditions satisfying requirement specification values and specifications relevant to procurement and manufacture of a target product on the basis of past design case examples and searching a matching design case example, the apparatus comprising:

a design case example storage configured to store each specification value of design case examples of past products and each specification category value relevant to procurement and manufacture necessary for manufacturing the target product;

a recommended weight storage configured to store specification values and recommended weight for every design case example corresponding to each specification category relevant to procurement and manufacture;

a requirement specification receiving circuit configured to receive requirement specification values of the target product from a user;

an order receiving policy receiving circuit configured to receive an order receiving policy for the target product, the order receiving policy comprising selection of requirement specification categories relevant to procurement and manufacture of the target product from the user, wherein an importance value is associated with each of the selected requirement specification categories selected by the user based on a level of importance of the respective selected requirement specification category in the procurement and manufacture of the target product;

a requirement specification satisfaction degree calculation circuit configured to:
   calculate an alignment degree of a specification value of the specification category of each design case example stored in the design case example storage for each of the requirement specification values, and
   calculate a satisfaction degree for every design case example and for every requirement specification category with reference to a satisfaction degree weight for each specification category based on the respective alignment degree;

a recommended degree calculation circuit configured to:
   read a recommended weight of a design case example stored in the recommended weight storage and
   calculate a recommended degree of each design case example for the order receiving policy received in the order receiving policy receiving circuit based on the satisfaction degree of each design case example; and a search result display configured to display the design case example read from the design case example storage and evaluated in a list of design case example search results for one of the requirement specification satisfaction degrees, the recommended degree, or total evaluation in the order of higher evaluation value.

2. The similar design case example search apparatus according to claim 1, further comprising a recommended weight setting circuit configured to:
   evaluate the intensity of a relation between each specification category value of the design case example information registered in the design case example storage, and each recommended weight factor relevant to procurement and manufacture,
   calculate a recommended weight for every design case example and for every requirement specification category, and
   record recommended weights for every design case example in the recommended weight storage.

3. The similar design case example search apparatus according to claim 1, further comprising a recommended weight setting circuit configured to:
   receive an order receiving policy such as cost preference and delivery time preference,
   change the recommended weight on the basis of the order receiving policy, and
   hold a recommended weight for every design case example and for every requirement specification category, in which the order receiving policy is reflected on the recommended weight to the recommended weight storage.

4. The similar design case example search apparatus according to claim 1, wherein the search result display is configured to display the design case example search result together with the requirement specification satisfaction degree, the recommended degree, or the total evaluation.

* * * * *